US012795928B2

(12) United States Patent
Jeong et al.

(10) Patent No.: US 12,795,928 B2
(45) Date of Patent: Nov. 10, 2026

(54) VERTICAL MEMORY DEVICE HAVING FIRST AND SECOND CONTACT PLUGS

(71) Applicant: Samsung Electronics Co., Ltd., Suwon-si (KR)

(72) Inventors: Jeawon Jeong, Suwon-si (KR); Dongha Shin, Suwon-si (KR); Bongsoon Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 615 days.

(21) Appl. No.: 18/301,575

(22) Filed: Apr. 17, 2023

(65) Prior Publication Data

US 2024/0130131 A1 Apr. 18, 2024

(30) Foreign Application Priority Data

Oct. 18, 2022 (KR) ........................ 10-2022-0134103

(51) Int. Cl.
*G11C 16/04* (2006.01)
*H10B 41/10* (2023.01)
(Continued)

(52) U.S. Cl.
CPC ......... *H10B 43/35* (2023.02); *G11C 16/0483* (2013.01); *H10B 41/10* (2023.02);
(Continued)

(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS 10,643,704 B2 5/2020 Oh et al.
11,087,844 B2 8/2021 Kim et al.
(Continued)

FOREIGN PATENT DOCUMENTS

CN 112447237 A 3/2021
KR 10-2020-0039800 A 4/2020
(Continued)

OTHER PUBLICATIONS

Extended European Search Report dated Mar. 12, 2024 for corresponding European Patent Application No. 23184803.7.
(Continued)

*Primary Examiner* — William B Partridge
*Assistant Examiner* — Gustavo G Ramallo
(74) *Attorney, Agent, or Firm* — Fish & Richardson P.C.

(57) ABSTRACT

A memory device may include word line patterns stacked on a substrate and spaced from each other in a vertical direction, a channel structure extending in the vertical direction, and first contact plugs and second contact plugs extending in the vertical direction. The substrate may include a cell area, a cell wiring area, and a through-hole wiring area. The word line patterns may be on the cell area and the cell wiring area and may extend to the cell wiring area in a direction parallel to an upper surface of the substrate. The first contact plugs may be on the cell wiring area and each may be electrically connected with a corresponding one of the word line patterns and insulated from remaining word line patterns other than the corresponding one of the word line patterns. The second contact plugs may be on the through-hole wiring area.

20 Claims, 12 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10W 20/41*** | (2026.01) |
| ***H10W 20/42*** | (2026.01) |

(52) U.S. Cl.

CPC ............. *H10B 41/27* (2023.02); *H10B 41/35* (2023.02); *H10B 43/10* (2023.02); *H10B 43/27* (2023.02); *H10W 20/42* (2026.01); *H10W 20/435* (2026.01)

(58) Field of Classification Search

CPC ........ H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | | |
|---|---|---|---|---|
| 11,239,166 | B2 | 2/2022 | Kim et al. | |
| 11,282,827 | B2 | 3/2022 | Yun et al. | |
| 2012/0140562 | A1 * | 6/2012 | Choe | H10D 30/693 257/329 |
| 2017/0179026 | A1 | 6/2017 | Toyama et al. | |
| 2020/0027893 | A1 * | 1/2020 | Yang | H10B 41/50 |
| 2020/0194453 | A1 * | 6/2020 | Lim | H10B 41/50 |
| 2021/0066276 | A1 | 3/2021 | Kim et al. | |
| 2021/0149598 | A1 | 5/2021 | Choi et al. | |
| 2021/0202457 | A1 | 7/2021 | Choi et al. | |
| 2022/0115394 | A1 | 4/2022 | Lee et al. | |
| 2022/0122673 | A1 | 4/2022 | Kim et al. | |

FOREIGN PATENT DOCUMENTS

| | | | |
|---|---|---|---|
| KR | 2021/0026617 | A | 3/2021 |
| KR | 2021/0060853 | A | 5/2021 |
| KR | 2021/0083545 | A | 7/2021 |
| KR | 2022/0050665 | A | 4/2022 |
| KR | 10-2022-0104459 | A | 7/2022 |

OTHER PUBLICATIONS

Office Action in Korean Appln. No. 10-2022-0134103, mailed on Apr. 13, 2026, 16 pages (with machine translation).

* cited by examiner

VERTICAL MEMORY DEVICE HAVING FIRST AND SECOND CONTACT PLUGS

CROSS-REFERENCE TO RELATED APPLICATIONS

This application claims priority under 35 U.S.C. § 119 to Korean Patent Application No. 10-2022-0134103, filed on Oct. 18, 2022 in the Korean Intellectual Property Office, the entire disclosure of which is incorporated by reference herein.

BACKGROUND

Embodiments of the present disclosure described herein relate to a vertical memory device.

Nowadays, as an information communication device supports various functions, a high-capacity and highly-integrated memory device may be required. As the size of a memory cell is reduced for high integration, operating circuits and/or wiring (or interconnection) structures included in the memory device for operations and electrical connection of the memory device may become more complex. As such, a memory device that provides excellent electrical characteristics while improving the degree of integration of the memory device may be required. In particular, the number of word lines stacked in a direction perpendicular to a substrate may increase, and a wiring contact structure for vertically penetrating and connecting the word lines with a circuit such as a pass transistor is being developed. However, as the number of word lines increases, device defects may occur due to the stress caused by a voltage difference of word lines.

SUMMARY

Embodiments of the present disclosure provide a memory device that reduces the stress due to a voltage difference of word lines, to which driving signals are applied, from among a plurality of word lines such that device defects decrease.

According to an embodiment, a memory device may include a substrate including a cell area, a cell wiring area, and a through-hole wiring area; word line patterns on the cell area and the cell wiring area, the word line patterns stacked on the substrate and spaced from each other in a vertical direction, the vertical direction being perpendicular to an upper surface of the substrate, and the word line patterns extending to the cell wiring area in a direction parallel to the upper surface of the substrate; a channel structure on the cell area, the channel structure extending in the vertical direction; first contact plugs on the cell wiring area, the first contact plugs extending in the vertical direction, each of the first contact plugs being electrically connected with a corresponding one of the word line patterns and insulated from remaining word line patterns other than the corresponding one of the word line patterns; and second contact plugs on the through-hole wiring area, the second contact plugs extending in the vertical direction. At least one of the second contact plugs may be electrically connected with a part of the word line patterns.

According to an embodiment, the word line patterns may include 2n or 2n+1 word line patterns stacked in the vertical direction on the upper surface of the substrate. A first word line pattern may be an uppermost one of the word line patterns and n may be a positive integer. The part of the word line patterns electrically connected with the at least one of the second contact plugs may be selected among the first word line pattern of the word line patterns to an n-th word line pattern of the word line patterns from an upper side of the word line patterns.

According to an embodiment, the memory device may include a lower transistor connected with the first contact plugs and the second contact plugs. The lower transistor may include a first pass transistor connected with the first contact plugs, and a second pass transistor connected with at least one of the second contact plugs electrically connected with another part of the word line patterns. Herein, the first pass transistor may be provided in the cell wiring area, and the second pass transistor may be provided in the through-hole wiring area.

According to an embodiment, the memory device may include a first semiconductor layer and a second semiconductor layer overlapping each other and bonded to each other. The first semiconductor layer may include a plurality of first semiconductor layers, and the plurality of first semiconductor layers may include a first lower semiconductor layer on the second semiconductor layer, and a first upper semiconductor layer on the first lower semiconductor layer.

BRIEF DESCRIPTION OF THE FIGURES

The above and other objects and features of the present disclosure will become apparent by describing in detail embodiments thereof with reference to the accompanying drawings.

DETAILED DESCRIPTION

While the present disclosure is capable to various modifications and alternative forms, specific embodiments are shown by way of examples in drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of inventive concepts.

Below, embodiments of the present disclosure will be described in detail with reference to the accompanying drawings.

Figure 1:
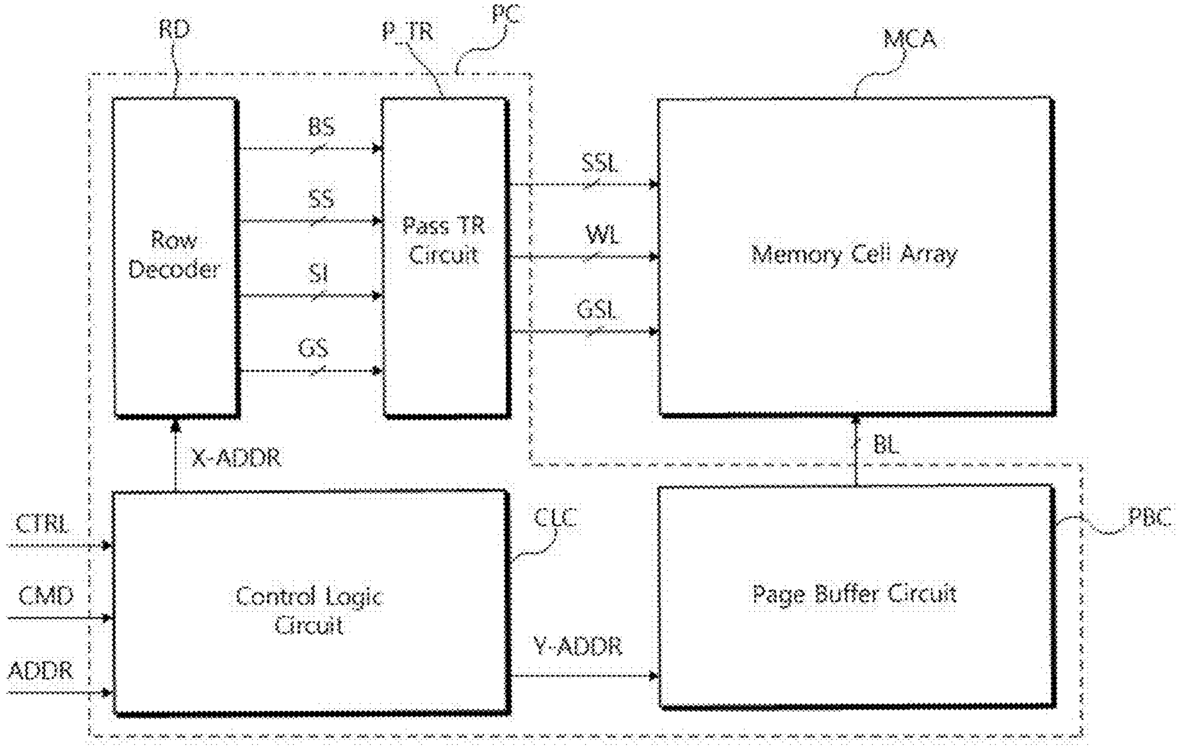
FIG. 1 is a block diagram illustrating a memory device according to an embodiment of the present disclosure.

FIG. 1 is a block diagram illustrating a memory device according to an embodiment of the present disclosure.

Referring to FIG. 1, a memory device may include a memory cell array MCA and a peripheral circuit PC, and the peripheral circuit PC may include a pass transistor circuit PTR, a row decoder RD, a control logic circuit CLC, and a page buffer circuit PBC. Although not illustrated, the peripheral circuit PC may further include a voltage generation unit, a data input/output circuit, an input/output interface, a temperature sensor, a command decoder, an address decoder, or the like. In embodiments of the present disclosure, the memory device may be a nonvolatile memory device, and below, the "memory device" may refer to a nonvolatile memory device.

The memory cell array MCA may be connected with the pass transistor circuit PTR through word lines WL, string selection lines SSL, and ground selection lines GSL and may be connected with the page buffer circuit PBC through bit lines BL. The memory cell array MCA may include a plurality of memory cells, and for example, the memory cells may be flash memory cells. Below, embodiments of the present disclosure will be described based on the case where the plurality of memory cells are NAND flash memory cells. However, the present disclosure is not limited thereto. In some embodiments, the plurality of memory cells may be resistive memory cells such as resistive random access memory (ReRAM) cells, phase change RAM (PRAM) cells, or a magnetic RAM (MRAM) cells.

In an embodiment, the memory cell array MCA may include a three-dimensional memory cell array, which includes a plurality of NAND strings. Each of the NAND strings may include memory cells that are respectively connected with word lines vertically stacked on the substrate. This will be described with reference to FIG. 3. However, the present disclosure is not limited thereto. In some embodiments, the memory cell array MCA may include a two-dimensional memory cell array, which includes a plurality of NAND strings arranged in row and column directions.

The control logic circuit CLC may generate various kinds of control signals for programming data in the memory cell array MCA, reading data from the memory cell array MCA, or erasing data stored in the memory cell array MCA, based on a command CMD, an address ADDR, and a control signal CTRL. For example, the control logic circuit CLC may output a row address X-ADDR and a column address Y-ADDR. The control logic circuit CLC may overall control various kinds of operations in the memory device.

The row decoder RD may output a block selection signal for selecting one of the plurality of memory blocks to block selection signal lines BS in response to the row address X-ADDR. Also, in response to the row address X-ADDR, the row decoder RD may output a word line driving signal for selecting one of the word lines WL of the selected memory block to word line driving signal lines SI, may output a string selection line driving signal for selecting one of the string selection lines SSL to string selection line driving signal lines SS, and may output a ground selection line driving signal for selecting one of the ground selection lines GSL to ground selection line driving signal lines GS. The page buffer circuit PBC may select some of the bit lines BL in response to the column address Y-ADDR. In detail, the page buffer circuit PBC operates as a write driver or a sense amplifier depending on an operating mode.

The pass transistor circuit PTR may be connected with the row decoder RD through the block selection signal lines BS, the string selection line driving signal lines SS, the word line driving signal lines SI, and the ground selection line driving signal lines GS. The string selection line driving signal lines SS, the word line driving signal lines SI, and the ground selection line driving signal lines GS may be referred to as "driving signal lines". The pass transistor circuit PTR may include a plurality of pass transistors, and the plurality of pass transistors may be controlled by the block selection signals received through the block selection signal lines BS such that the string selection line driving signals, the word line driving signals, and the ground selection line driving signals are provided to the string selection lines SSL, the word lines WL, and the ground selection lines GSL.

Figure 2:
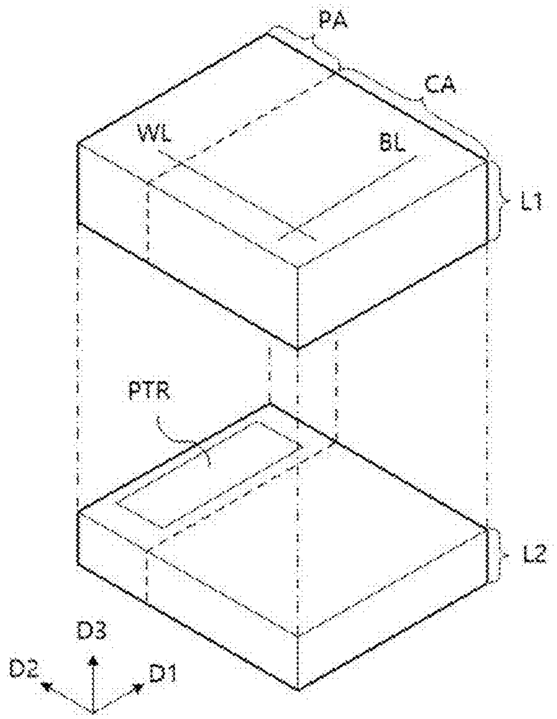
FIG. 2 is a diagram illustrating a structure of a memory device according to an embodiment of the present disclosure.

FIG. 2 is a diagram illustrating a structure of a memory device according to an embodiment of the present disclosure.

Referring to FIGS. 1 and 2, the memory device may include a first semiconductor layer L1 and a second semiconductor layer L2. In an embodiment, assuming that two directions that define a plane parallel to upper surfaces of the first semiconductor layer L1 and the second semiconductor layer L2 are a first direction D1 and a second direction D2 and a direction perpendicular to the first direction D1 and the second direction D2 is a third direction D3, the first semiconductor layer L1 may be stacked over/on the second semiconductor layer L2 in the third direction D3.

In detail, the second semiconductor layer L2 may be under the first semiconductor layer L1 in the third direction D3, and thus, the second semiconductor layer L2 may be disposed close to the substrate. In an embodiment, the memory cell array MCA may be formed in the first semiconductor layer L1, and the peripheral circuit PC may be formed in the second semiconductor layer L2. That is, the memory device may have a structure in which the memory cell array MCA is disposed over a portion of the peripheral circuit PC, that is, a cell over periphery (COP) structure.

The first semiconductor layer L1 may include a cell area CA and a peripheral area PA.

The plurality of memory cells may be disposed in the cell area CA. In the first semiconductor layer L1, the plurality of bit lines BL may extend in the first direction D1, and the plurality of word lines WL may extend in the second direction D2.

Figure 4:
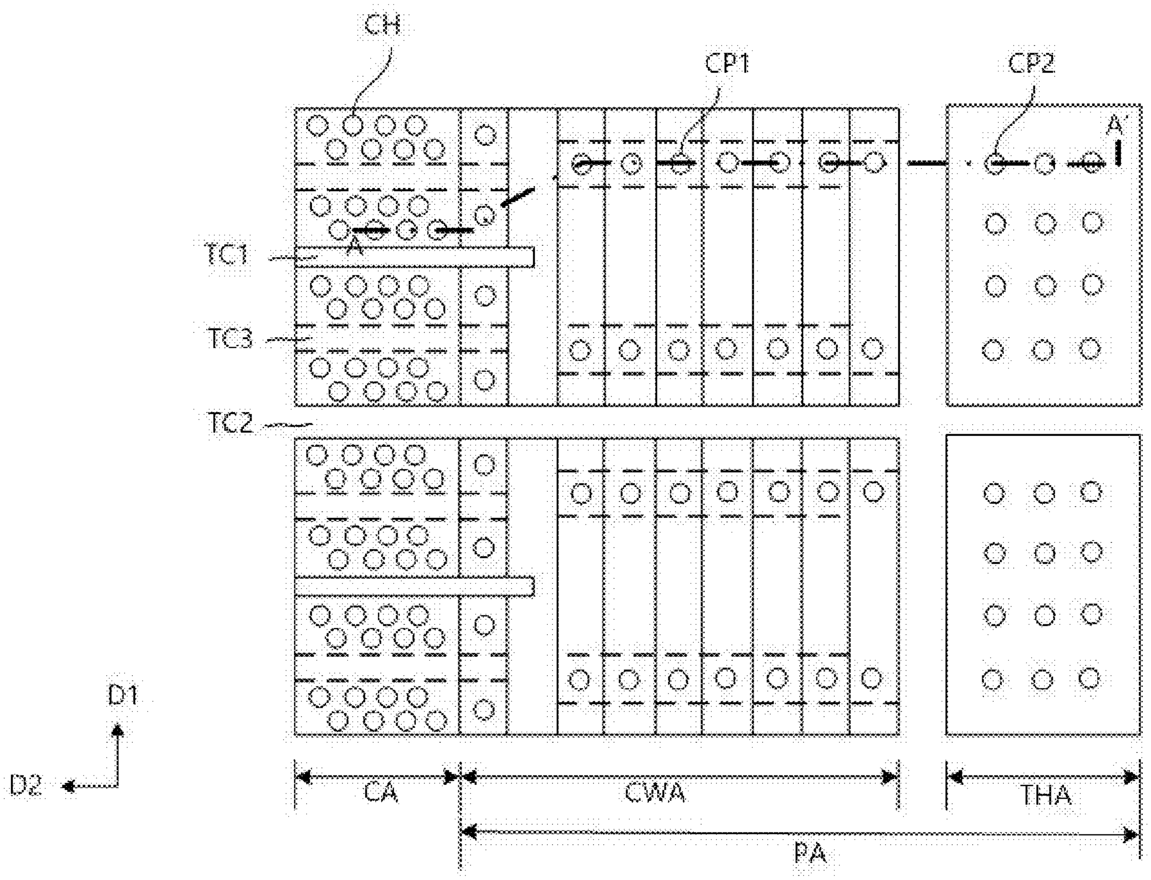
FIG. 4 is a plan view for describing a memory device according to an embodiment of the present disclosure.

The peripheral area PA may include a cell wiring area CWA (refer to FIG. 4) and a through-hole wiring area THA (refer to FIG. 4).

The cell wiring area CWA may refer to a portion (or an area) where the plurality of word lines WL are extended from the cell area CA and are connected with any other component (e.g., the pass transistor circuit PTR). In the cell wiring area CWA, one ends of the word lines WL may be implemented in a stair shape along the third direction D3. In this case, the cell wiring area CWA is referred to as a "stair area" or a "word line extension area".

The through-hole wiring area THA is disposed adjacent to the cell wiring area CWA and refers to a portion (or an area) where through holes are provided.

The second semiconductor layer L2 may include a substrate 101 (refer to FIG. 5), and the peripheral circuit PC that includes semiconductor elements, such as a transistor, and patterns for connecting the semiconductor elements through wirings is provided on the substrate 101.

In an embodiment of the present disclosure, the first semiconductor layer L1 and the second semiconductor layer L2 may be stacked and electrically connected. In this case, a plurality of patterns for electrically connecting the word lines WL and the bit lines BL of the memory cell array MCA and the peripheral circuit PC formed in the second semiconductor layer L2 may be formed.

Figure 3A:
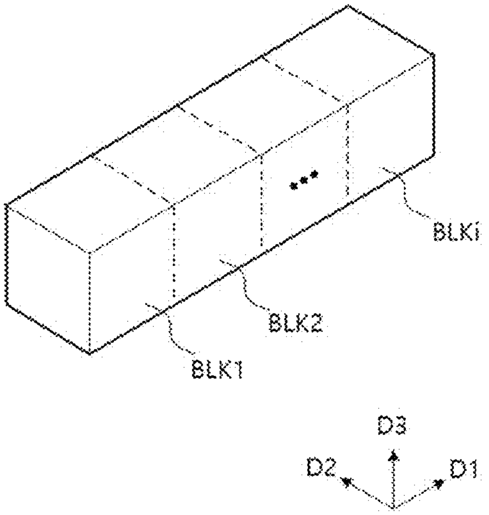
FIG. 3A is a diagram illustrating a memory cell array according to an embodiment of the present disclosure.
Figure 3B:
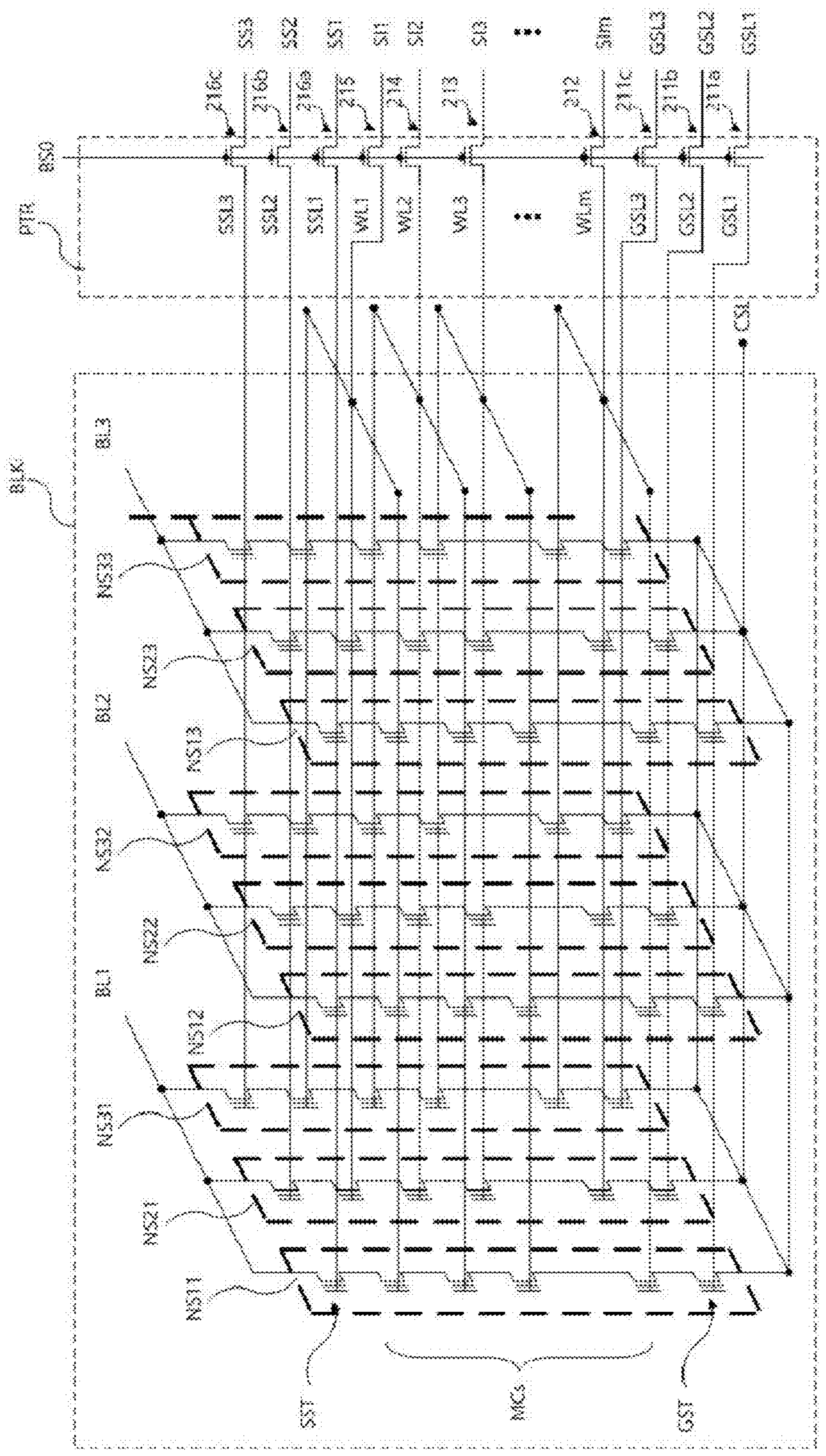
FIG. 3B is a circuit diagram illustrating a pass transistor circuit and an i-th memory block according to an embodiment of the present disclosure.

FIG. 3A is a diagram illustrating the memory cell array MCA according to an embodiment of the present disclosure. FIG. 3B is a circuit diagram illustrating the pass transistor circuit PTR and an i-th memory block BLKi according to an embodiment of the present disclosure.

Referring to FIGS. 3A and 3B, the memory cell array may include a plurality of memory blocks BLK1 to BLKi (i being a positive integer). Each of the plurality of memory blocks BLK1 to BLKi may have a three-dimensional structure (or a vertical structure). In detail, each of the plurality of memory blocks BLK1 to BLKi may include a plurality of NAND strings extending in the third direction D3. Each of the plurality of memory blocks BLK1 to BLKi may also include the ground selection lines GSL, a plurality of word lines WL1 to WLm (m being a positive integer), and the string selection lines SSL.

In this case, the plurality of NAND strings may be provided to be spaced from each other in the first direction D1 and the second direction D2 as much as a specific distance. The plurality of memory blocks BLK1 to BLKi may be selected by the row decoder RD (refer to FIG. 1). For example, the row decoder RD may select a memory block corresponding to a block address from among the plurality of memory blocks BLK1 to BLKi.

The pass transistor circuit PTR may be connected with the i-th memory block BLKi through the ground selection lines GSL, the plurality of word lines WL1 to WLm (collectively referred to as "WL"), and the string selection lines SSL. That is, a pass transistor P_TR may be connected between the ground selection line driving signal line GS and the ground selection line GSL, pass transistors may also be connected between word line driving signal lines SI1 to SIm and the plurality of word lines WL1 to WLm, and the pass transistor P_TR may be connected with the string selection line driving signal line SS and the string selection line SSL.

When a first block selection signal is activated, the pass transistors P_TR may transfer driving signals provided through the ground selection line driving signal line GS, the word line driving signal lines SI1 to SIm, and the string selection line driving signal line SS to the ground selection line GSL, the plurality of word lines WL1 to WLm, and the string selection line SSL, respectively.

Herein, the number of NAND strings, the number of word lines WL, the number of bit lines BL, the number of ground selection lines GSL, and the number of string selection lines SSL may be variously changed depending on embodiments.

In an embodiment of the present disclosure, first NAND strings NS11, NS21, and NS31 may be provided between a bit line BL1 and a common source line CSL, second NAND strings NS12, NS22, and NS32 may be provided between a bit line BL2 and the common source line CSL, and third NAND strings NS13, NS23, and NS33 may be provided between a bit line BL3 and the common source line CSL. Each NAND string (e.g., NS33) may include a string selection transistor SST, a plurality of memory cells MCs, and a ground selection transistor GST that are connected in series.

In each NAND string, the string selection transistor SST is connected with a corresponding string selection line among string selection lines SSL1, SSL2, and SSL3 (collectively referred to as "SSL"). In each NAND string, the plurality of memory cells MCs are respectively connected with the word lines WL1 to WLm. In each NAND string, the ground selection transistor GST is connected with a corresponding ground selection line among ground selection lines GSL1, GSL2, and GSL3. In each NAND string, the string selection transistor SST is connected with a corresponding bit line among the bit lines BL1, BL2, and BL3, and the ground selection transistor GST is connected with the common source line CSL.

In an embodiment, word lines (e.g., WL1) placed at the same height, that is, at the same level may be connected in common with each other, the string selection lines SSL1 to SSL3 may be separated from each other, and the ground selection lines GSL1 to GSL3 may be separated from each other.

The pass transistor circuit PTR may include pass transistors 211*a* to 211*c* respectively connected with the ground selection lines GSL1 to GSL3, pass transistors 212 to 215 respectively connected with the word lines WL1 to WLm, and pass transistors 216*a* to 216*c* respectively connected with the string selection lines SSL1 to SSL3.

The pass transistors 211*a* to 211*c*, 212 to 215, and 216*a* to 216*c* may be turned on depending on the first block selection signal provided through the i-th block selection signal line BSi such that the driving signals provided through the string selection line driving signal lines SS1 to SS3, the word line driving signal lines SH to SIm, and the ground selection line driving signal lines GS1 to GS3 are respectively transferred to the string selection lines SSL1 to SSL3, the plurality of word lines WL1 to WLm, and the ground selection lines GSL1 to GSL3.

Figure 5:
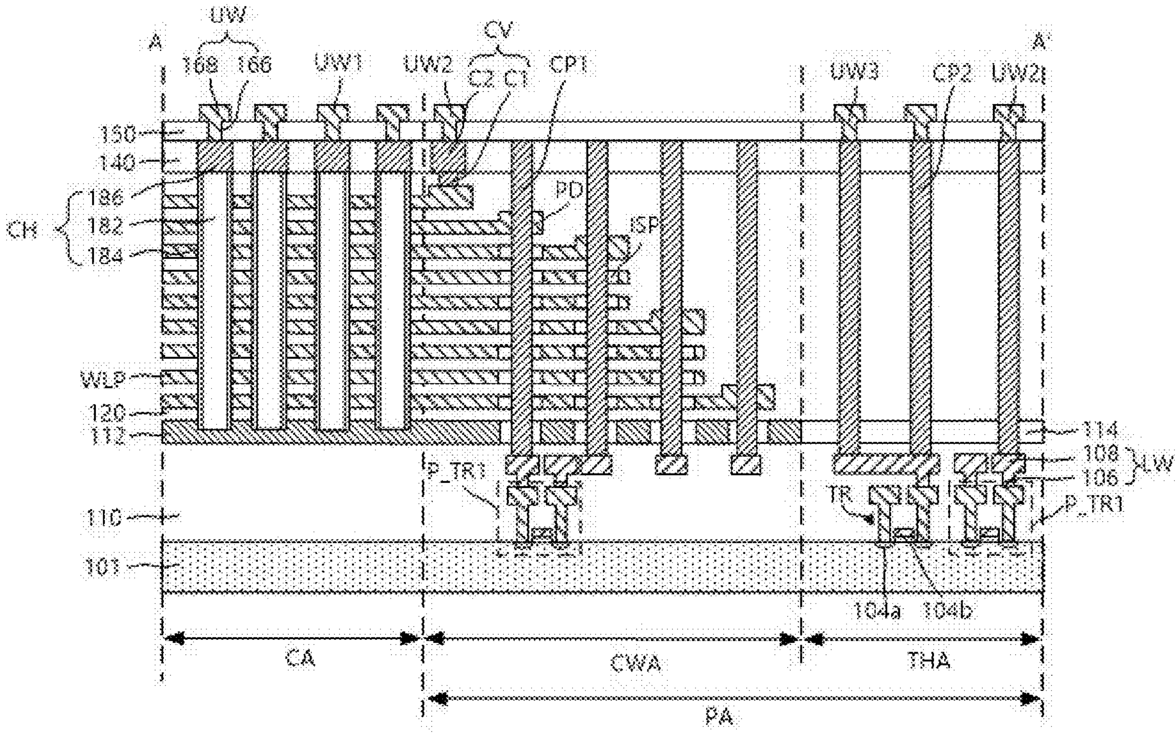
FIG. 5 is a cross-sectional view of a memory device taken along line A-A' of FIG. 4.

FIG. 4 is a plan view for describing a memory device according to an embodiment of the present disclosure, and FIG. 5 is a cross-sectional view of a memory device taken along line A-A' of FIG. 4. In FIGS. 4 and 5, for convenience of description, some components that are identical or similar are omitted.

Referring to FIGS. 4 and 5, the memory device according to an embodiment of the present disclosure includes a circuit pattern provided on the substrate 101. The substrate 101 may include the cell area CA, the cell wiring area CWA, and the through-hole wiring area THA.

On the circuit pattern, a channel structure CH may be provided in the cell area CA, a first contact plug CP1 may be provided in the cell wiring area CWA, and a second contact plug CP2 may be provided in the through-hole wiring area THA. The first and second contact plugs CP1 and CP2 may be electrically connected with corresponding circuit patterns, respectively. The first and second contact plugs CP1 and CP2 may be formed of a conductive material such as metal, metal oxide, or doped polysilicon.

The substrate 101 may include a semiconductor material such as silicon, germanium, or silicon-germanium, or a group III-V compound such as GaP, GaAs, or GaSb. According to some embodiments, the substrate 101 may be a silicon-on-insulator (SOI) substrate or a germanium-on-insulator (GOI) substrate.

The circuit pattern may include lower transistors TR and lower wirings LW, and the lower wirings LW may include lower contact vias 106, lower contact pads 108, etc. In an embodiment, the lower wirings LW may be formed in a multi-layer structure.

A lower insulating layer 110 covering the circuit pattern may be provided on the substrate 101. The lower contact vias 106 may be in contact with impurity regions 104*a* and/or a gate 104*b* of the lower transistor TR.

A base pattern 112 may be provided on the lower insulating layer 110. In embodiments, the base pattern 112 may be on a lower side (or a lower portion) of the cell area CA. The base pattern 112 may include, for example, a polysilicon layer or a single crystal silicon layer. A base insulating layer 114 may be provided on the lower insulating layer 110 and between the base patterns 112. For example, the base insulating layer 114 may be disposed in an area through which the first and second contact plugs CP1 and CP2 pass.

Below, configurations of the cell area CA, the cell wiring area CWA, and the through-hole wiring area THA will be sequentially described.

A first structure including a first insulating layer 120 and conductive word line patterns WLP repeatedly stacked may be provided on the base pattern 112 in the cell area CA.

The word line patterns WLP may be formed of a conductive material, for example, a material containing metal. For example, the word line patterns WLP may include a tungsten material.

In an embodiment of the present disclosure, all the word line patterns WLP may be formed of the same material, but the present disclosure is not limited thereto. For example, the word line patterns WLP may be formed of various materials depending on a wiring kind, a wiring location, etc. For example, some of the patterns and the remaining patterns thereof may be formed of different materials. Also, in drawings, the word line patterns WLP are illustrated to have similar shapes, similar thicknesses, similar widths, etc., but this is only for convenience of description. It is obvious that the shape, thickness, and width of the word line patterns WLP are variously changed or modified depending on a wiring kind, a wiring location, etc.

A second insulating layer 140 may be provided on the first structure.

The second insulating layer 140 may include an insulating material such as silicon oxide or silicon nitride. In an embodiment, the second insulating layer 140 may include a TEOS (Tetraethyl Orthosilicate) material.

The word line patterns WLP may include the string selection line SSL (refer to FIG. 3B), the word line WL, and the ground selection line GSL.

A channel hole that is extended to an upper surface of the base pattern 112 through the second insulating layer 140 and the first structure may be provided, and the channel structure CH may be provided within the channel hole. The channel structure CH penetrates the word line patterns WLP and is extended in the vertical direction (e.g., the third direction D3). The channel structure CH may be in contact with the upper surface of the base pattern 112.

The channel structure CH may include a channel 182, a charge storage structure 184, and an upper conductive pattern 186. The upper conductive pattern 186 may be provided on the channel 182 and may fill an upper portion of the channel hole. The channel 182 and the upper conductive pattern 186 may include polysilicon.

An upper surface of the channel structure CH may be placed on the same plane as an upper surface of the second insulating layer 140.

In an embodiment of the present disclosure, a first trench TC1 and a second trench TC2 that penetrate the second insulating layer 140 and the first structure and are extended in the first direction D1 may be included. The first trench TC1 may be placed within the first structure so as to be provided as a word line cutting area. The plurality of first structures may be separated from each other by the second trench TC2. Although not illustrated, the base pattern 112 may be exposed by the first trench TC1, and the base pattern 112 or the base insulating layer 114 may be exposed by the second trench TC2.

In an embodiment, a third trench TC3 that is provided as a string selection line cutting area may be further included. The third trench TC3 may be formed by etching word line patterns WLP of the first structure, which correspond to the uppermost layer and at least one lower layer of the uppermost layer.

In an embodiment, an insulating material may be provided within the first to third trenches TC1, TC2, and TC3.

A second structure in which an edge portion facing the first direction D1 has a stair shape may be provided on the base insulating layer 114 in the cell wiring area CWA. Accordingly, the edge portion of the second structure in the first direction D1 may have different planes for respective layers.

The second structure may include the first insulating layer 120, the word line patterns WLP extended in the horizontal direction, pad patterns PD provided on end portions of the word line patterns WLP, the first contact plugs CP1 extended in the vertical direction, and insulating patterns ISP insulating the word line patterns WLP from the first contact plugs CP1. The word line pattern WLP and the first insulating layer 120 may be alternately stacked.

The word line patterns WLP may be stacked to be spaced from each other in the direction (e.g., the third direction D3) perpendicular to the upper surface of the substrate 101 and may be extended in the direction parallel to the upper surface of the substrate 101.

The word line patterns WLP of the first structure may be extended to the second structure. The pad patterns PD are provided on the end portions of the word line patterns WLP. Each pad pattern PD is electrically connected with the word line pattern WLP of each layer. A portion where the pad patterns PD respectively corresponding to the word line patterns WLP are provided may have a stair shape along a surface of the substrate 101. Each pad pattern PD may be provided to be in direct contact with an extension portion of the word line pattern WLP belonging to the same layer as each pad pattern PD, and thus, each pad pattern PD is electrically connected with the word line pattern WLP belonging to the same layer. The word line pattern WLP and the pad pattern PD may include the same conductive material.

The pad pattern PD may be provided as a pad that is in contact with the first contact plug CP1 electrically connecting the word line pattern WLP and the lower circuit pattern (e.g., a pass transistor).

In embodiments, an upper surface of the pad pattern PD may be higher than that of the word line pattern WLP formed in the same layer, and a thickness of the pad pattern PD may be thicker than that of the word line pattern WLP formed in the same layer.

In the cell wiring area CWA, first contact holes that are extended to an upper portion of the lower insulating layer 110 through the second insulating layer 140, the second structure, and the base insulating layer 114 may be provided. An upper surface of the lower wiring LW may be exposed through each of the first contact holes. The first contact plug CP1 may be provided within the first contact hole.

The first contact plugs CP1 penetrate some of the word line patterns WLP and are extended in the third direction D3. The first contact plugs CP1 are electrically connected with the pad pattern PD in one layer and are insulated from the word line patterns WLP in the remaining layers other than the one layer to which the connected pad pattern PD belongs. Herein, a side wall of the first contact plug CP1 is in contact with the pad pattern PD of the corresponding word line pattern WLP. The side wall of the first contact plug CP1 is insulated from the remaining word line patterns WLP other than the corresponding word line pattern WLP, with the insulating patterns ISP interposed therebetween. A lower end portion of the first contact plug CP1 may be in contact with the upper surface of the lower wiring LW.

Accordingly, the word line patterns WLP of the respective layers and the lower transistors TR (in particular, the pass transistors) may be electrically connected by the first contact plugs CP1, and the word line pattern WLP through which the first contact plug CP1 does not pass may be electrically connected with at least one of the second contact plugs CP2.

To this end, in the cell wiring area CWA, components for connecting the word line pattern WLP, through which the first contact plug CP1 does not pass, and a component for connecting the word line pattern WLP and the second contact plugs CP2, for example, a connecting via CV and upper wirings UW (refer to a second upper wiring UW to be described later) may be provided.

To form the connecting via CV, a second contact hole that penetrates the second insulating layer 140 and a portion of the first insulating layer 120 may be provided. Upper surfaces of some of the word line patterns WLP may be exposed through the second contact hole. The connecting via CV electrically connected with some of the word line patterns WLP is provided within the first contact hole. The connecting via CV includes a lower connection via C1 that is in contact with the upper surfaces of the corresponding word line patterns WLP through a portion of the first insulating layer 120 and an upper connection via C2 that is connected with the lower connection via C1 through the second insulating layer 140.

In an embodiment, the first contact plug CP1 and the connecting via CV may include a conductive material, for example, metal. As an example, the first contact plug CP1 and/or the connecting via CV may include metal such as tungsten, copper, or aluminum. As an example, the first contact plug CP1 and/or the connecting via CV may include a barrier metal pattern and a metal pattern.

Upper surfaces of the first contact plug CP1 and the connecting via CV may be placed on the same plane as an upper surface of the second insulating layer 140.

In the through-hole wiring area THA, a third contact hole that is extended to an upper portion of the lower insulating layer 110 through the second insulating layer 140, the first insulating layer 120, and the base insulating layer 114 may be provided. An upper surface of the lower wiring LW may be exposed through the third contact hole. The second contact plug CP2 may be provided within the third contact hole. The second contact plug CP2 is extended in the vertical direction, that is, in the third direction D3 to penetrate the first insulating layer 120 and the second insulating layer 140.

A side wall of the second contact plug CP2 may not be in contact with a conductive material, and a lower surface of the second contact plug CP2 may be in contact with the upper surface of the lower wiring LW. Accordingly, the electrical connection with lower driving circuits (e.g., lower transistors) may be made by the second contact plug CP2.

In an embodiment, the second contact plug CP2 may include the same material as the first contact plug CP1, for example, metal.

An upper surface of the second contact plug CP2 may be placed on the same plane as the upper surface of the second insulating layer 140. In an embodiment, the upper surfaces of the channel structure CH, the first contact plug CP1, and the second contact plug CP2 may be placed on substantially the same plane.

A third insulating layer 150 is provided on the second insulating layer 140 of the cell area CA, the cell wiring area CWA, and the through-hole wiring area THA.

The upper wirings UW that are electrically connected with lower components through the third insulating layer 150 may be provided on the third insulating layer 150. The upper wirings UW may be composed of upper contact vias 166 and upper contact pads 168.

The upper wirings UW include first to third upper wirings UW1, UW2, and UW3; the first upper wirings UW1 are provided in the cell area CA and are electrically connected with the channel structure CH. The second upper wiring UW2 is provided in the cell wiring area CWA and the through-hole wiring area THA and electrically connects the connecting via CV and some of the second contact plugs CP2. The third upper wiring UW3 is connected with the others of the second contact plugs CP2.

In detail, the first upper wiring UW1 is in contact with the upper conductive pattern 186 of the channel structure CH through the second insulating layer 140. The first upper wiring UW1 may correspond to the bit line BL. The second upper wiring UW2 is in contact with an upper surface of the upper connection via C2 and upper surfaces of some of the second contact plugs CP2 through the second insulating layer 140 and connects the connecting via CV and some of the second contact plugs CP2. The third upper wiring UW3 is in contact with upper surfaces of second contact plugs CP2, which are not connected with the second upper wiring UW2, from among the second contact plugs CP2 through the second insulating layer 140. In an embodiment, separate upper wirings UW may not be provided on the first contact plugs CP1, and the first upper wiring UW1 and the third upper wiring UW3 may be connected directly/indirectly or may not be connected.

Although not illustrated, a fourth insulating layer covering the first to third upper wirings UW1, UW2, and UW3 may be further provided.

In an embodiment of the present disclosure, one of the second contact plugs CP2 may be connected with the word line pattern WLP corresponding to the uppermost layer from among the word line patterns WLP, and the first contact plugs CP1 may be connected with the remaining word line patterns WLP other than the word line pattern WLP corresponding to the uppermost layer. For example, in the word line patterns WLP, when the string selection line SSL may be disposed in the uppermost layer and the word lines WL are disposed below the uppermost layer, the string selection line SSL may be connected with one of the second contact plugs CP2 through the connecting via CV and the second upper wiring UW2, and the word lines WL may be connected with the first contact plugs CP1 corresponding thereto.

Driving elements, that is, lower transistors TR are respectively connected with lower ends of the first and second contact plugs CP1 and CP2. The lower transistor TR may include a first pass transistor P_TR1 connected with the first contact plugs CP1, and a second pass transistor P_TR2 connected with at least one of the second contact plugs CP2 electrically connected with the word line patterns WLP, which are not connected with the first pass transistor P_TR1, from among the word line patterns WLP.

In an embodiment, the upper wirings UW and the lower wirings LW may be formed of a conductive material, for example, a single layer/multi-layer/alloy metal or a metal compound, and the first to third insulating layers 120, 140, and 150 may include an insulating material such as silicon oxide or silicon nitride.

In an embodiment, the first pass transistor P_TR1 may be provided under the word line patterns WLP where the first contact plugs CP1 are disposed, that is, in the cell wiring area CWA, and the second pass transistor P_TR2 may be provided in the through-hole wiring area THA where the second contact plugs CP2 are provided. Herein, as the first pass transistors P_TR1 are directly provided under the first contact plugs CP1, a length of a wiring connected with the word line WL may be limited and/or minimized; in this case, a loading time skew for a signal applied to the word line WL may decrease, and a chip size may be miniaturized.

In an embodiment, a memory element with the above structure may reduce a defect of a memory device due to a stress between a ground voltage and a program voltage, which are applied to a structure in which the first contact plugs CP1 penetrate the word line patterns WLP, and a breakdown voltage (BV) according to the stress. That is, in a structure in which the word line patterns WLP are connected with the lower pass transistor TR in a through-hole electrode shape only by using the first contact plugs CP1, the stress between the ground voltage and the program voltage applied to the word line patterns WLP that are adjacent to the first contact plug CP1 penetrating the most number of word line patterns WLP is relatively high, thereby causing the BV defect. According to the present disclosure, a portion where the stress is relatively high is connected with the lower transistor TR through 1) the upward connecting via CV and 2) a separate location, which does not cause the BV defect, for example, the through-hole wiring area THA, instead of the first contact plug CP1 penetrating a plurality of word lines WL.

This will be described in detail below.

Figure 6A:
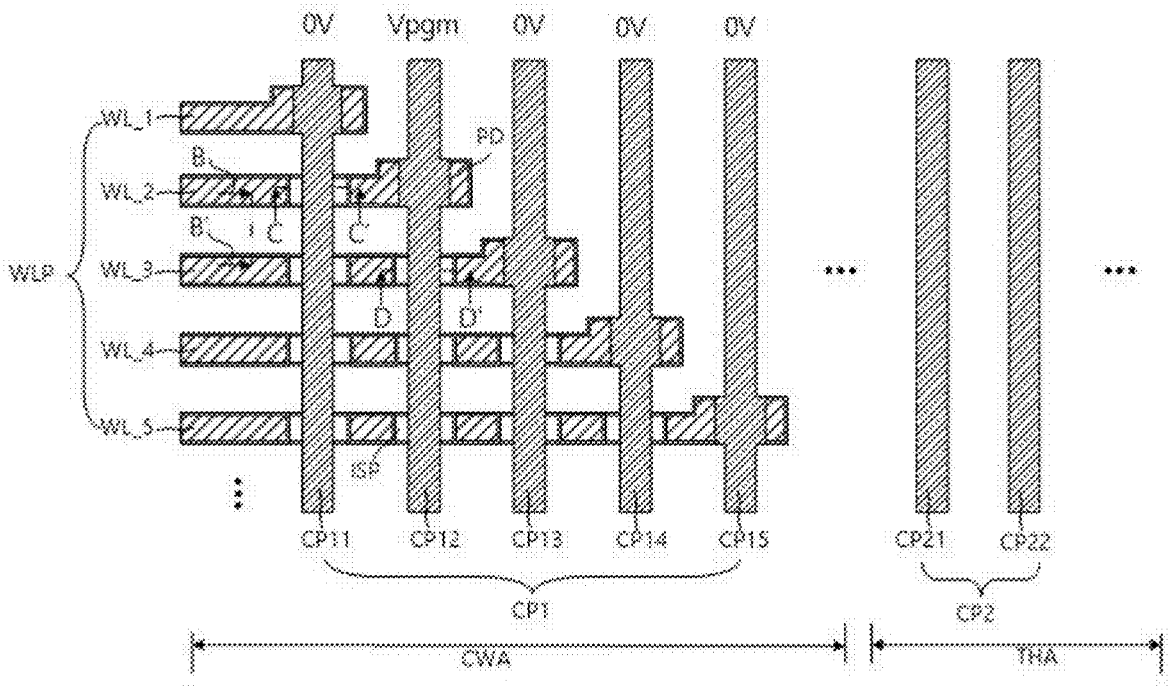
FIGS. 6A and 6B are cross-sectional views illustrating a portion of a cell wiring area according to the related art and a portion of a cell wiring area according to an embodiment of the present disclosure.
Figure 6B:
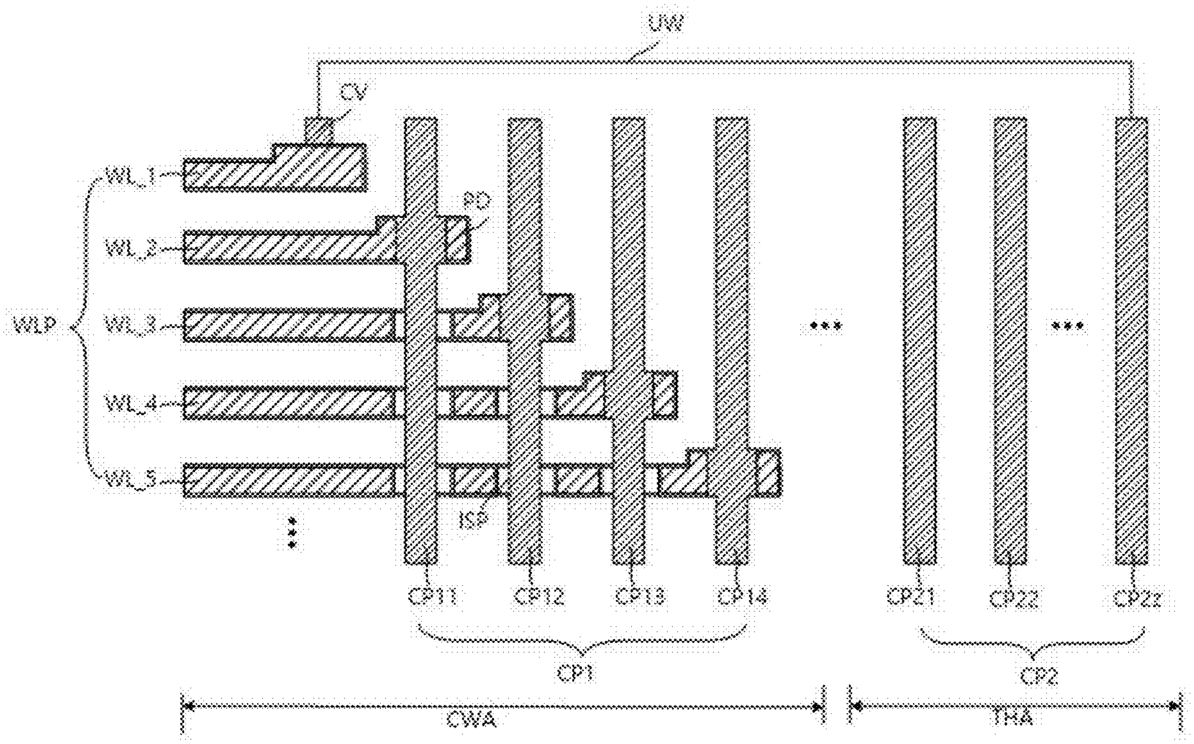
Figure 7A:
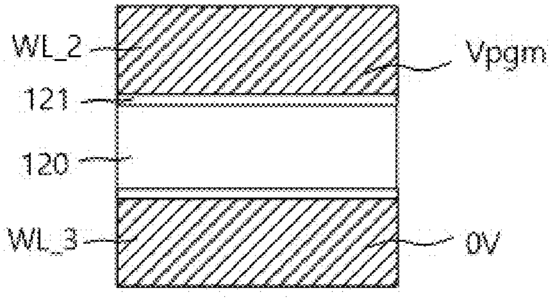
FIGS. 7A to 7C are plan views of portions corresponding to line B-B', line C-C', and line D-D' FIG. 6A.
Figure 7B:
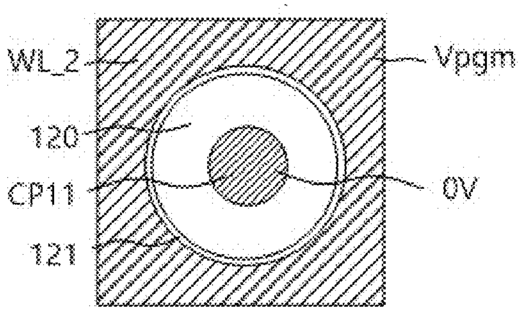
Figure 7C:
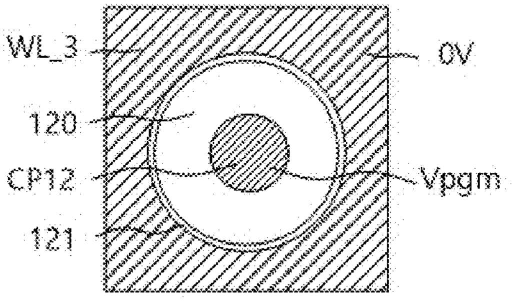

FIG. 6A is a cross-sectional view illustrating a portion of the cell wiring area CWA according to the related art, FIG. 6B is a cross-sectional view illustrating a portion of the cell wiring area CWA according to an embodiment of the present disclosure, and FIGS. 7A to 7C are plan views of portions corresponding to line B-B', line C-C', and line D-D' of FIG. 6A. In FIGS. 6A and 6B, for convenience of description, there are illustrated some of wirings (e.g., the first to fifth word line patterns WLP (WL_1, WL_2, . . . , WL5) in order from an upper side). Reference numeral 121 that is not described in FIGS. 7A to 7C may refer to a layer that is an additional insulating layer and is provided to limit and/or prevent some components from being etched in a manufacturing process. The additional insulating layer may be formed of various materials, for example, may be formed of aluminum oxide.

Referring to FIG. 6A, the word line patterns WLP repeatedly stacked to form a stair shape and the first contact plugs CP1 extended in the vertical direction through the word line patterns WLP are provided in the cell wiring area CWA. The second contact plugs CP2 extended in the vertical direction are provided in the through-hole wiring area THA.

The word line patterns WLP may include the string selection line SSL, the word line WL, and the ground selection line (not illustrated) described with reference to FIG. 3B. In the embodiment illustrated in FIG. 6A, the first word line pattern WLP may be the string selection line SSL, and the second to fifth word line patterns WLP may be the word lines WL.

In an embodiment of the present disclosure, the first word line pattern WL_1 is electrically connected with a first contact plug CP11 disposed on the leftmost side, the second word line pattern WL_2 is electrically connected with a first contact plug CP12 disposed adjacent to the first contact plug CP11, and the third word line pattern WL_3 is electrically connected with a first contact plug CP13 disposed adjacent to the first contact plug CP12. Each word line pattern WLP is electrically connected with the corresponding first contact plug CP1 in the above manner.

As it goes from the top toward the bottom, the stacked word line patterns WLP are extended from the cell area CA to be longer toward the cell wiring area CWA. To this end, each word line pattern WLP includes the pad pattern PD at an end portion of a word line pattern part extended to the cell wiring area CWA. As a side surface of each of the first contact plugs CP1 is in direct contact with the corresponding pad pattern PD, each of the word line patterns WLP is electrically connected with each of the first contact plugs CP1. As such, the first contact plug CP11 is connected with the pad pattern PD at the end portion of the first word line pattern WL_1 and penetrate the remaining word line patterns WL_2, WL_3, WL_5 other than the word line pattern WL_1. The first contact plug CP12 is connected with the pad pattern PD at the end portion of the second word line pattern WL_2 and penetrate the remaining word line patterns WL_3, WL_4, WL_5 other than the word line patterns WL_1 and WL_2. As it goes from the left side toward the right side, the number of word line patterns WLP that the first contact plug CP1 penetrates decreases.

In the memory device with the above structure, driving signals for each memory operation may be applied to the word line patterns WLP. For example, a program voltage Vpgm (e.g., about 17 V) may be applied to a word line WL selected from the word lines WL, to which a ground voltage (e.g., 0 V) is applied, depending on a selection word line driving signal.

In FIG. 6A, an example in which the program voltage Vpgm is applied to the second word line pattern WL_2 (e.g., the first word line WL1) through the first contact plug CP12 is illustrated. When the driving signal is applied, as illustrated in FIG. 7A, a vertical voltage difference between the program voltage Vpgm and the ground voltage of 0 V occurs between the selected second word line pattern WL_2 and another word line pattern WLP adjacent to the selected second word line pattern WL_2, for example, the third word line pattern WL_3; as illustrated in FIG. 7B, a horizontal voltage difference between the program voltage Vpgm and the ground voltage of 0 V occurs between the selected second word line pattern WL_2 and the first contact plug CP11 adjacent to the selected second word line pattern WL_2; as illustrated in FIG. 7C, a horizontal voltage difference between the program voltage Vpgm and the ground voltage of 0 V occurs between the first contact plug CP12 connected with the selected second word line pattern WL_2 and the third word line pattern WL_3 adjacent to the first contact plug CP12.

However, because the first contact plug CP11 connected with the first word line pattern WL_1 belonging to the uppermost layer from among the word line patterns WLP is formed to penetrate the remaining word line patterns WL_2, WL_3, WL_5 other than the first word line pattern WL_1 (or the lower word line patterns WL_2, WL_3, WL_5 placed below the first word line pattern WL_1), when the driving signal is applied, in particular, when the program voltage Vpgm is applied, the stress due to the voltage difference between the ground voltage of 0 V and the program voltage Vpgm is the greatest. Accordingly, there is a high possibility that the device defect due to the BV occurs. To solve the above issue, a way to increase the width and thickness of the uppermost pad pattern PD being in contact with the first contact plug CP1 may be used; however, in this case, the way to increase the width and thickness may cause an increase in the size of the memory device (or memory element) and may affect the final yield of the memory device. For this reason, it is difficult to select the way to increase the width and thickness.

The voltage difference-based stress may be caused by a voltage difference due to any other signal capable of occurring in the process of driving the memory device, as well as the voltage difference between the program voltage Vpgm and the ground voltage of 0 V applied to the word line patterns WLP and the first contact plugs CP1 adjacent to each other.

To solve the above issue, according to an embodiment of the present disclosure, the upper wiring UW and the second contact plug CP2 are used instead of the first contact plug CP11, as illustrated in FIG. 6B. In detail, the first contact plug CP11 whose stress is the greatest is not formed to pass through the remaining word line patterns WL_2, WL_3, WL5 other than the first word line pattern WL_1, but it is first connected with the upper wiring UW through the connecting via CV, which is connected with the upper surface of the pad pattern PD, and is then connected with any other component by using a portion not adjacent to the word line patterns WLP, for example, by using a second contact plug CP2*z* of the through-hole wiring area THA.

The second contact plug CP2*z* connected with the word line patterns WLP through the upper wiring UW may be provided on one side of second contact plugs CP21, CP22 . . . , CP2*z*-1 connected with any other wirings. For example, the second contact plug CP2*z* may be provided to be more distant from the cell wiring area CWA than the second contact plugs CP21, CP22 . . . , CP2*z*−1. However, the location of the second contact plug CP2*z* connected with the word line patterns WLP is not limited thereto. For example, the location of the second contact plug CP2*z* may be differently determined depending on how the second contact plugs CP21, CP22 . . . , CP2*z*−1 connected with any other wirings are disposed.

In an embodiment, because the through-hole wiring area THA is formed of an insulating molding member, the voltage difference-based stress may be limited and/or minimized when the driving signal is applied.

As such, in an embodiment of the present disclosure, it may be possible to avoid the voltage difference-based stress and the BV between the first contact plug CP11 connected with the uppermost word line pattern WL_1 and the remaining word line patterns WL_2 to WL_5.

Figure 8:
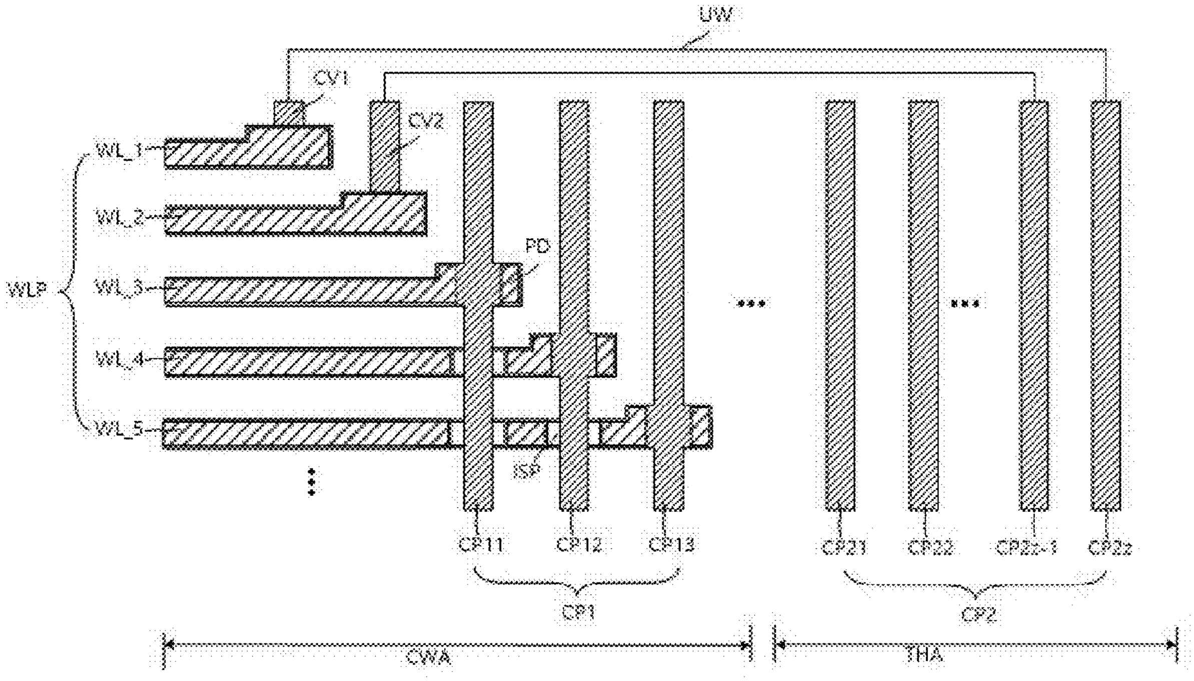
FIG. 8 is a cross-sectional view illustrating a cell wiring area in a memory device according to another embodiment of the present disclosure.

FIG. 8 is a cross-sectional view illustrating a cell wiring area in a memory device according to another embodiment of the present disclosure. In the following embodiment, the content that is different from the above content will be mainly described to avoid redundancy.

In the above embodiment, the uppermost word line pattern WL_1 experiencing the greatest stress is connected with the upper wiring UW through the connecting via CV, but the word line pattern WLP to be connected with the upper wiring UW through the connecting via CV may be provided in plurality.

Referring to FIG. 8, a first contact plug inevitably penetrating a plurality of lower word line patterns WLP and upper word line patterns WLP connected with the first contact plug suffer from the stress due to a voltage difference of driving signals, which makes the possibility of defect high. In an embodiment, at least two or more of word line patterns WLP having the high probability of defect may be connected with the second contact plugs CP2 through a plurality of upper wirings UW. The first word line pattern WL_1 in the cell wiring area CWA may be connected with the upper wiring UW through a first connecting via CV1, and the upper wiring UW may be connected with the second contact plug CP2*z* in the through-hole wiring area THA. The second word line pattern WL_2 in the cell wiring area CWA may be connected with another upper wiring UW through a second connecting via CV2, and the another upper wiring UW may be connected with the second contact plug CP2*z*−1 in the through-hole wiring area THA.

Herein, the first word line pattern WL_1 may be the string selection line SSL, and the second word line pattern WL_2 may be the uppermost word line WLm.

An embodiment in which the word line patterns WLP connected with the second contact plugs CP2 through the upper wirings UW are the string selection line SSL and the word line WLm is described above, but the present disclosure is not limited thereto. For example, the word line patterns WLP connected with the second contact plugs CP2 through the upper wirings UW may correspond to various other signal wirings.

For example, the word line patterns WLP connected with the second contact plugs CP2 through the upper wirings UW may include a gate induced drain leakage (GIDL) line disposed adjacent to the string selection line SSL.

Figure 9:
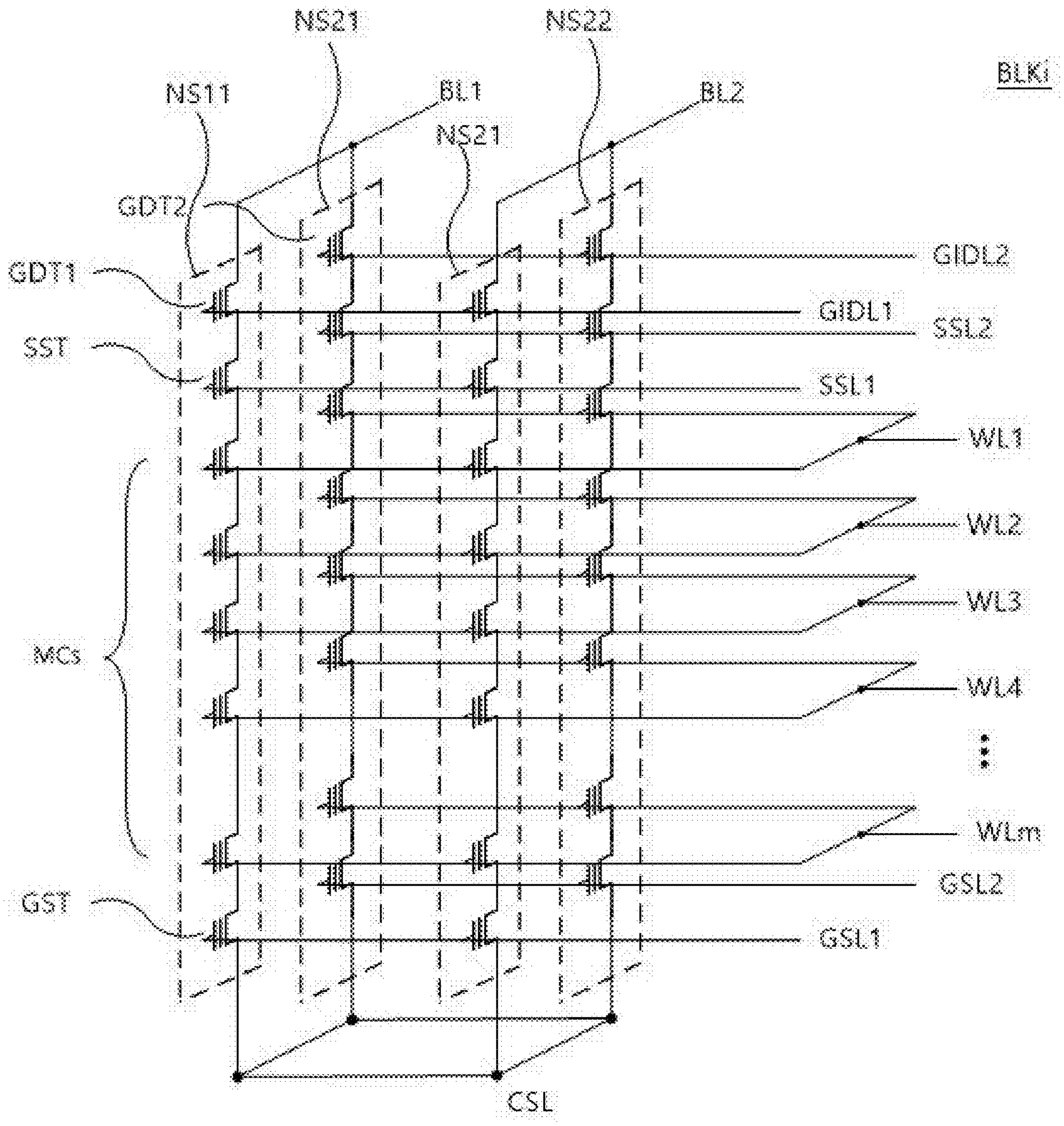
FIG. 9 is a circuit diagram illustrating an i-th memory block according to an embodiment of the present disclosure.

FIG. 9 is a circuit diagram illustrating the i-th memory block BLKi for describing a gate induced drain leakage (GIDL) line, according to an embodiment of the present disclosure. For convenience of description, one memory block that including four NAND strings NS11, NS12, NS21, and NS22 is illustrated, and a difference with the circuit diagram of FIG. 3B is illustrated as an example.

Referring to FIG. 9, a plurality of cell transistors may be connected in series between the first bit line BL1 and the common source line CSL. For example, the plurality of cell transistors may include GIDL transistors, the string selection transistor SST, the memory cells MC1 to MC5, and the ground selection transistor GST.

The GIDL transistors may be disposed at a lower end and an upper end of the NAND string NS11. For example, a first GIDL transistor GDT1 and a second GIDL transistor GDT2 may be connected with the first bit line BL1 and the second bit line BL2 at the upper end of the NAND string NS11.

In the erase operation, an erase voltage may be provided through the first bit line BL1 connected with a drain of the first GIDL transistor GDT1, and the erase voltage may be provided through the common source line CSL connected with a source of the second GIDL transistor GDT2. That is, the erase voltages may be provided through opposite ends of the NAND transistor NS11. However, the present disclosure is not limited thereto. For example, the GIDL transistor may be provided only at the upper end of the NAND string NS11, or the GIDL transistor may be provided only at the lower end of the NAND string NS11. In this case, the erase voltage may be provided through only one of the opposite ends of the NAND string NS11.

Figure 10:
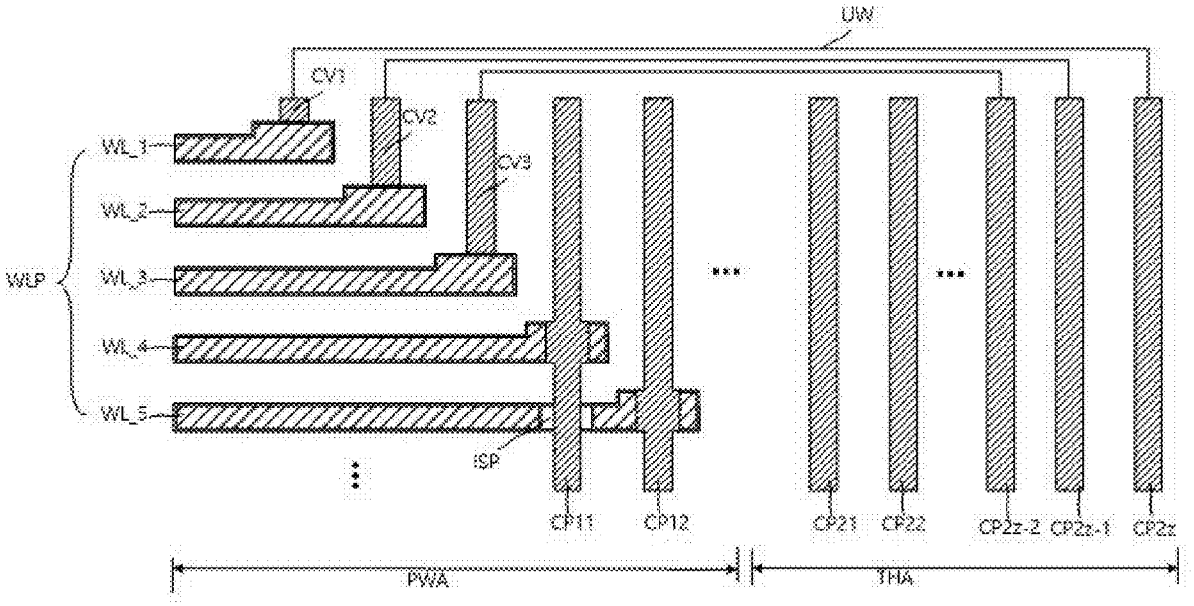
FIG. 10 is a cross-sectional view illustrating a portion of a cell wiring area of a memory device according to an embodiment of the present disclosure, which is disclosed in a circuit diagram of FIG. 9.

FIG. 10 is a cross-sectional view illustrating a portion of the cell wiring area CWA of a memory device according to an embodiment of the present disclosure, which is disclosed in a circuit diagram of FIG. 9.

Referring to FIG. 10, a plurality of upper word line patterns WLP (e.g., WP_1, WP_2, and WP_3) may be connected with the second contact plugs CP2*z*, CP2*z*-1, and CP2*z*-2 through the upper wirings UW; in detail, the first word line pattern WL_1 may be a gate induced drain leakage line GIDL, the second word line pattern WL_2 may be the string selection line SSL, and the third word line pattern WL_3 may be the uppermost word line WLm.

The gate induced drain leakage line GIDL being the first word line pattern WL_1 in the cell wiring area CWA may be connected with the upper wiring UW through the first connecting via CV1, and the upper wiring UW may be connected with the second contact plug CP2*z* in the through-hole wiring area THA. The string selection line SSL being the second word line pattern WL_2 in the cell wiring area CWA may be connected with another upper wiring UW through the second connecting via CV2, and the another upper wiring UW may be connected with the second contact plug CP2*z*−1 in the through-hole wiring area THA. The word line WLm being the third word line pattern WL_3 may be connected with the other upper wiring UW through the third connecting via CV3, and the other upper wiring UW may be connected with the second contact plug CP2*z*-2 in the through-hole wiring area THA. In some embodiments, the third word line pattern WL_3 may be a dummy word line.

As such, the wiring that is used to connect the word line patterns WLP with the second contact plug CP2 through the upper wiring UW may be selected from wirings, which are extended in the horizontal direction, have a stair shape in the cell wiring area CWA, and are capable of being connected with the first contact plug CP1, as well as the word lines WL. For example, the wiring that is used to connect the word line patterns WLP with the second contact plug CP2 through the upper wiring UW may include a dummy word line, a center dummy word line, and a GIDL ground selection line, as well as the gate induced drain leakage line GIDL. As in the structure described above, at least one of the gate induced drain leakage line GIDL, the dummy word line, the center dummy word line, and the GIDL ground selection line may be connected with the second contact plug CP2.

In FIGS. 8 and 10, two or three upper word line patterns WLP are illustrated as being connected with the second contact plugs CP2 through the upper wirings UW, but the present disclosure is not limited thereto. For example, the connection between the word line patterns WLP and the second contact plugs CP2 may be variously changed or modified depending on the number of word line patterns WLP. In an embodiment, the number of word line patterns WLP connected with the second contact plugs CP2 through the upper wirings UW may be within upper side 50% of all the stacked word line patterns WLP. Herein, the "upper side" means patterns from the first word line to the n-th word line provided on the upper side, when 2n or (2n+1) word line patterns WLP (n being a positive integer) are provided. As such, the word line patterns WLP connected with the second contact plugs CP2 are disposed above the word line patterns WLP connected with the first contact plug CP1.

In an embodiment of the present disclosure, a driving circuit (e.g., the pass transistor P_TR (refer to FIG. 5)), may be connected with each of the word line patterns WLP such that the driving signal is applied to each word line pattern WLP; the pass transistor P_TR may be disposed at various locations in the memory device.

Figure 11:
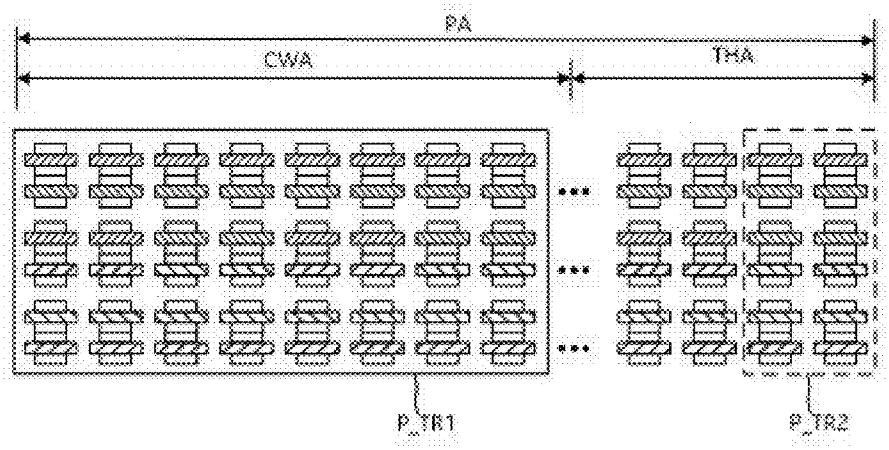
FIG. 11 is a diagram illustrating the arrangement of pass transistors electrically connected with word line patterns in a memory device according to an embodiment of the present disclosure.

FIG. 11 is a diagram illustrating the arrangement of pass transistors electrically connected with word line patterns in a memory device according to an embodiment of the present disclosure.

Referring to FIG. 11, a pass transistor may include the first pass transistor P_TR1 provided under the first contact plugs CP1 connected with the word line patterns WLP and the second pass transistor P_TR2 provided under the second contact plug CP2 connected with the word line pattern WLP through the upper wiring.

Herein, the first pass transistors P_TR1 may be directly provided under the first contact plugs CP1 connected with the corresponding word line patterns WLP, and thus, lengths of wirings connected with most word lines WL may be limited and/or minimized. In addition, because the second pass transistors P_TR2 are provided under the second contact plugs CP2 connected with the word line patterns WLP through the upper wirings UW, the stress according to the application of the driving signals and the defect due to the stress may be limited and/or minimized.

Also, in an embodiment of the present disclosure, as a pass transistor(s) (e.g., the first pass transistor P_TR1) connected with the remaining word line patterns WLP other than the uppermost word line pattern(s) WLP are disposed on a lower side of the cell wiring area CWA in a cross-sectional view and a pass transistor(s) (e.g., the second pass transistor P_TR2) connected with the uppermost word line pattern(s) WLP are disposed on a lower side of the through-hole wiring area THA in a cross-sectional view, a pass transistor area belonging to the through-hole wiring area THA is increased, and a pass transistor area belonging to the cell wiring area CWA is decreased as much as the increment. As such, the technical advantages described above may be obtained without increasing the overall size of the memory device.

In an embodiment of the present disclosure, an example in which the pass transistors have the same size and are spaced from each other at equal intervals is illustrated, but this is for convenience of description. For example, the size, layout, and interval of the pass transistors may be different from those described above. For example, the pass transistors may be implemented with different sizes depending on areas and connected wirings, and an interval between adjacent pass transistors may be differently set.

In addition, locations where the first pass transistor P_TR1 and the second pass transistor P_TR2 are disposed may be determined to be different from those according to the embodiment.

Figure 12A:
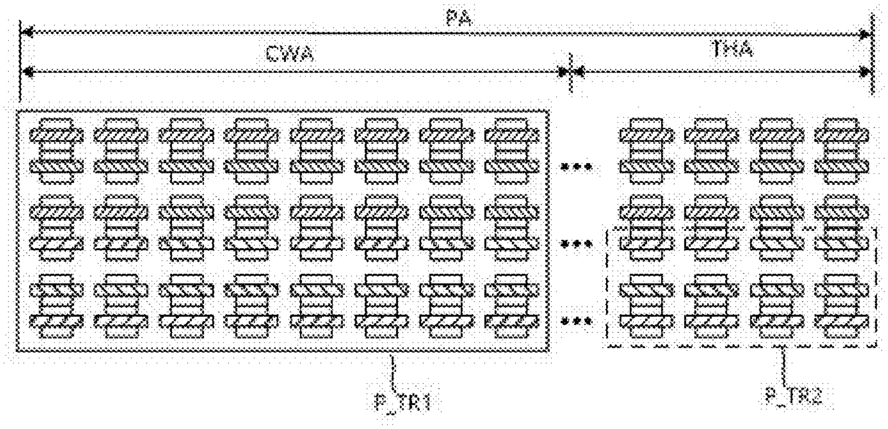
FIGS. 12A to 12C are diagrams illustrating the arrangement of a first pass transistor and a second pass transistor electrically connected with word line patterns in a memory device according to another embodiment of the present disclosure.
Figure 12B:
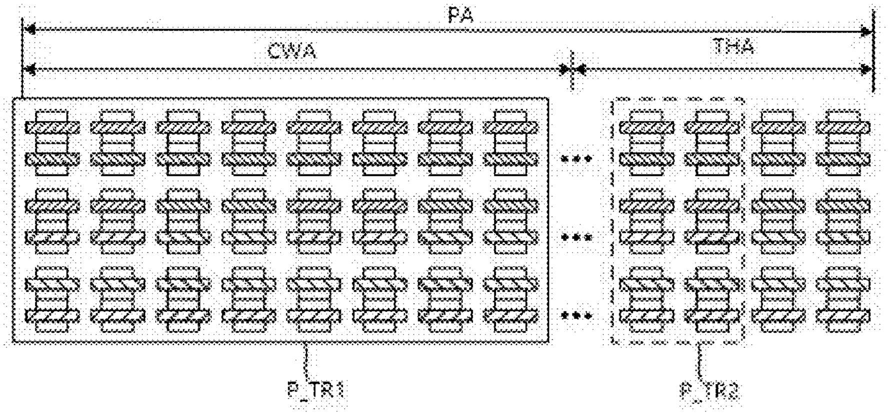
Figure 12C:
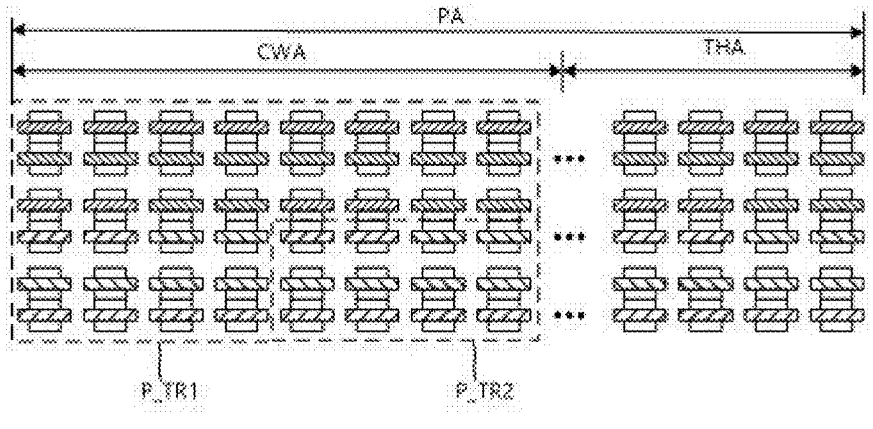

FIGS. 12A to 12C are diagrams illustrating the arrangement of the first pass transistor P_TR1 and the second pass transistor P_TR2 electrically connected with the word line patterns WLP in a memory device according to another embodiment of the present disclosure.

Referring to FIGS. 12A to 12C, the first pass transistor P_TR1 may be provided in the cell wiring area CWA and may be provided under the first contact plug CP1. The second pass transistor P_TR2 may be provided in the through-hole wiring area THA as illustrated in FIGS. 12A and 12B or may be provided in the cell wiring area CWA as illustrated in FIG. 12C.

In FIGS. 12A to 12C, the locations of the first pass transistor P_TR1 and the second pass transistor P_TR2 may not be absolute and may be variously changed depending on the connection with the lower wiring LW.

In the memory device according to an embodiment of the present disclosure, as described above, the first pass transistor P_TR1 and the second pass transistor P_TR2 may be disposed in various structures while maintaining the size of the memory element small, and thus, the freedom of circuit design may be improved.

As described above, with the development of the semiconductor process technology, the number of stacked memory cells of the memory cell array MCA may increase, in other words, the number of word lines WL stacked in the vertical direction may increase; in this case, because the number of pass transistors for driving the word lines WL increases, the area occupied by the pass transistor circuit PTR may increase. According to an embodiment of the present disclosure, the second semiconductor layer L2 in which the peripheral circuit PC is formed may be disposed, when viewed in a cross-sectional view, under the first semiconductor layer L1 in which the memory cell array MCA is formed, and in particular, the pass transistor circuit PTR including the first pass transistor P_TR1 may be disposed, when viewed in a cross-sectional view, under a stair area of the word lines WL. As such, because the area in which the pass transistor circuit PTR is disposed overlap the stair area of the word lines WL in the vertical direction, even though the number of pass transistors increases depending on the increase in the number of stacked word lines WL, the chip size of the memory device may be limited and/or prevented from increasing.

In an embodiment of the present disclosure, the structure and the layout of the first semiconductor layer L1 are not limited thereto.

For example, in an embodiment of the present disclosure, the first semiconductor layer L1 described above may be provided in a multi-layer structure. For example, the first semiconductor layer L1 may include a first upper semiconductor layer L1*b* and a first lower semiconductor layer L1*a*, and the number of first semiconductor layers L1 is not limited thereto.

Figure 13:
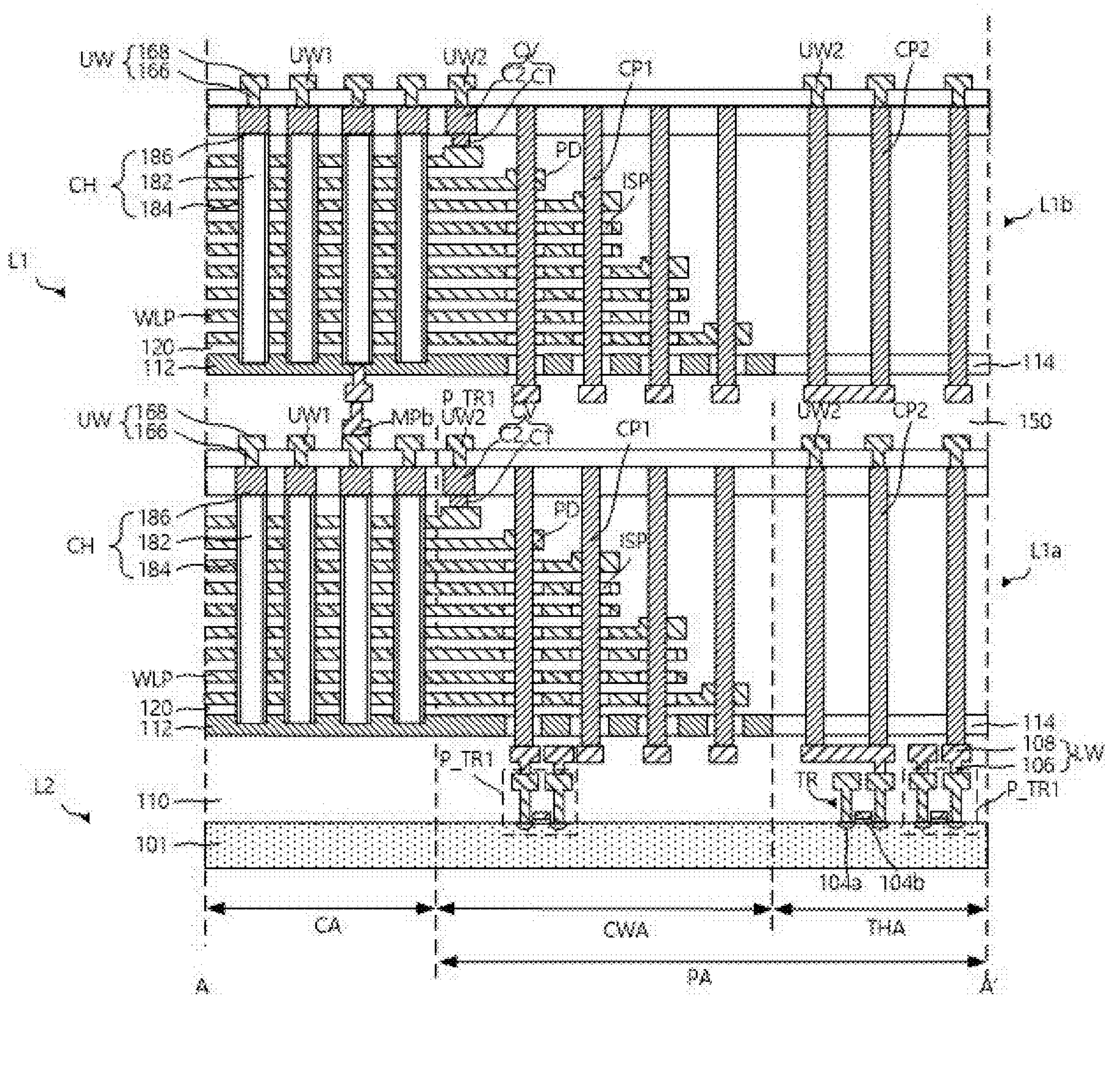
FIG. 13 is a diagram illustrating a memory device according to another embodiment of the present disclosure.

FIG. 13 is a diagram illustrating a memory device according to an embodiment of the present disclosure. FIG. 13 shows a portion of a memory device including two first semiconductor layers L1, that is, the first lower semiconductor layer L1*a* and the first upper semiconductor layer L1*b*. In an embodiment, the first lower semiconductor layer L1*a* and the first upper semiconductor layer L1*b* are formed in a shape substantially similar to that of FIG. 5 except for some components, but the present disclosure is not limited thereto. For example, it is obvious that the first lower semiconductor layer L1*a* and the first upper semiconductor layer L1*b* have different structures. Below, for convenience of description, components that are substantially identical or similar to those described above will be described regardless of whether locations or structures are reversed. Also, in the following drawings, only some of wirings included in the first lower semiconductor layer L1*a* and the first upper semiconductor layer L1*b* are illustrated as an example. In particular, in the connection structure of the first lower semiconductor layer L1*a* and the first upper semiconductor layer L1*b*, additional wirings (not illustrated) may be provided, and the first lower semiconductor layer L1*a* and the first upper semiconductor layer L1*b* may be connected with each other through the additional wirings.

In FIG. 13, the memory device according to an embodiment of the present disclosure may include the first semiconductor layer L1 and the second semiconductor layer L2 and may be formed in a chip to chip (C2C) structure. Herein, the C2C structure may be implemented by manufacturing an upper chip including the cell area CA, that is, the first semiconductor layer L1 on a first substrate 112 in the shape of a chip, manufacturing a second semiconductor layer including the peripheral circuit PC on the second substrate 101 different from the first substrate 112 in the shape of a chip, and connecting the first semiconductor layer L1 and the second semiconductor layer L2 in a bonding manner.

For example, the bonding manner may mean a manner of electrically connecting a bonding metal formed in the uppermost metal layer of the first semiconductor layer L1 and a bonding metal formed in the uppermost metal layer of the second semiconductor layer L2. For example, when the bonding metals are formed of copper (Cu), the bonding manner may be a Cu—Cu bonding manner, and the bonding metals may also be formed of aluminum or tungsten.

In the memory device according to an embodiment of the present disclosure, the first semiconductor layer L1 may be stacked on the second semiconductor layer L2, and the first semiconductor layer L1 may include the first lower semiconductor layer L1*a* provided on the second semiconductor layer L2 and the first upper semiconductor layer L1*b* provided on the first lower semiconductor layer L1*a*.

The first lower semiconductor layer L1*a* and the first upper semiconductor layer L1*b* may be connected with each other through various wirings, for example, may be electrically connected through a first through-hole electrode THVa and a second through-hole electrode THVb of the cell area CA. Also, although not illustrated, the first lower semiconductor layer L1*a* and the first upper semiconductor layer L1*b* may be electrically connected by additional through-hole wirings provided in the through-hole wiring area THA.

A metal pattern MP may be provided in the first lower semiconductor layer L1*a* between the first through-hole electrode THVa and the second through-hole electrode THVb, so as to be electrically connected with each other. The metal pattern MP may include a plurality of layers; in this case, metal patterns facing each other or a metal pattern and a wiring may be connected by the bonding manner.

In an embodiment of the present disclosure, the first semiconductor layer L1 may be provided in a structure different from the structure illustrated in FIG. 13.

Figure 14:
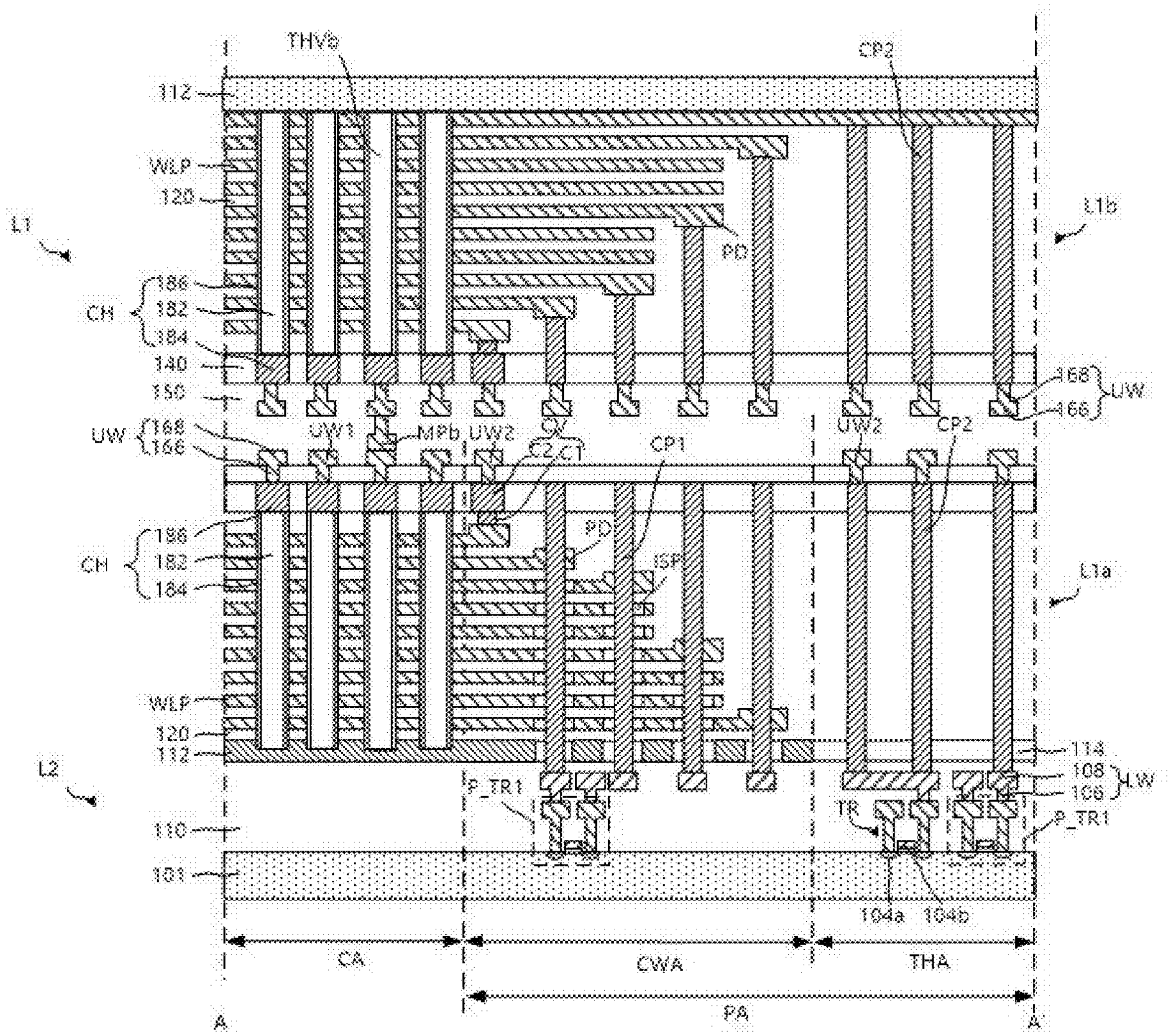
FIG. 14 is a diagram illustrating a memory device according to another embodiment of the present disclosure.

FIG. 14 is a diagram illustrating a memory device according to another embodiment of the present disclosure. According to an embodiment of the present disclosure, the second semiconductor layer L2 may be disposed over the first semiconductor layer L1, the first semiconductor layer L1 may include the first upper semiconductor layer L1*b* and the first lower semiconductor layer L1*a*, and one of the first upper semiconductor layer L1*b* and the first lower semiconductor layer L1*a* may be provided in a reverse shape. For example, as illustrated in FIG. 14, in the first lower semiconductor layer L1*a*, the word line patterns WLP of the cell wiring area CWA may have a stair shape; in the first upper semiconductor layer L1*b*, the word line patterns WLP of the cell wiring area CWA may have a reverse stair shape. In contrast, although not illustrated, in the first lower semiconductor layer L1*a*, the word line patterns WLP of the cell wiring area CWA may have a reverse stair shape; in the first upper semiconductor layer L1*b*, the word line patterns WLP of the cell wiring area CWA may have a stair shape. Even in any one of the above embodiments, a structure capable of avoiding the stress due to a voltage difference of word lines, to which driving signals are applied, from among a plurality of word lines and the BV defect due to the stress may be provided.

According to an embodiment of the present disclosure, it may be possible to avoid the stress due to a voltage difference of word lines, to which driving signals are applied, from among a plurality of word lines and the BV defect due to the stress.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
a substrate including a cell area, a cell wiring area, and a through-hole wiring area;
word line patterns on the cell area and the cell wiring area, the word line patterns stacked on the substrate and spaced from each other in a vertical direction, the vertical direction being perpendicular to an upper surface of the substrate, and the word line patterns extending to the cell wiring area in a direction parallel to the upper surface of the substrate,
wherein the word line patterns comprise one or more first word line patterns and a plurality of second word line patterns;
a channel structure on the cell area, the channel structure extending in the vertical direction;
first contact plugs on the cell wiring area, the first contact plugs extending in the vertical direction, each of the first contact plugs being electrically connected with a corresponding one of the second word line patterns, insulated from remaining word line patterns other than the corresponding one of the second word line patterns, and extending above and below the corresponding one of the second word line patterns; and
second contact plugs on the through-hole wiring area, the second contact plugs extending in the vertical direction,
wherein each of one or more second contact plugs of the second contact plugs is electrically connected with a corresponding one of the one or more first word line patterns through a connecting via that terminates at the corresponding one of the first word line patterns.

2. The memory device of claim 1, wherein
one of the second contact plugs is connected with an uppermost word line pattern among the word line patterns, and
the first contact plugs are connected with the word line patterns other than the uppermost word line pattern among the word line patterns.

3. The memory device of claim 1, wherein
the word line patterns include 2n or 2n+1 word line patterns stacked in the vertical direction on the upper surface of the substrate,
n is a positive integer, and
the one or more first word line patterns are selected from among an uppermost one of the word line patterns to an n-th word line pattern of the word line patterns from an upper side of the word line patterns.

4. The memory device of claim 1, wherein the word line patterns include a string selection line and a word line.

5. The memory device of claim 4, wherein
the word line is included in the second word line patterns and connected with one of the first contact plugs, and
the string selection line is included in the one or more first word line patterns and connected with one of the second contact plugs.

6. The memory device of claim 1, wherein
the word line patterns include a plurality of word lines and a string selection line,
the string selection line is included in the one or more first word line patterns and connected with one of the second contact plugs,
one or more of the plurality of word lines are included in the second word line patterns and connected with corresponding ones of the first contact plugs, and one or more others of the plurality of word lines are included in the one or more first word line patterns and connected with the second contact plugs.

7. The memory device of claim 6, wherein the one or more others of the plurality of word lines connected with the second contact plugs are above the one or more of the plurality of word lines connected with the first contact plugs.

8. The memory device of claim 6, wherein the word line patterns include at least one of:
a gate induced drain leakage line adjacent to the string selection line; or
a dummy line adjacent to the plurality of word lines.

9. The memory device of claim 8, wherein
(i) the word line patterns include the gate induced drain leakage line, and the gate induced drain leakage line is connected with a corresponding one of the second contact plugs,
(ii) the word line patterns include the dummy line, and the dummy line is connected with an other second contact plug among the second contact plugs, or
(iii) the word line patterns include the gate induced drain leakage line and the dummy line, and the gate induced drain leakage line is connected with the corresponding one of the second contact plugs and the dummy line is connected with the other second contact plug among the second contact plugs, and
the corresponding one of the second contact plugs and the other second contact plug are different from each other among the second contact plugs.

10. The memory device of claim 1, further comprising:
pad patterns on the cell wiring area and electrically connected with the word line patterns.

11. The memory device of claim 10, wherein
the pad patterns and word line patterns provide a plurality of conductive layers,
the plurality of conductive layers each include one of the pad patterns and one of the word line patterns,
each of the first contact plugs is electrically connected with a corresponding one of the pad patterns and insulated from remaining pad patterns other than the corresponding one of the pad patterns, such that each corresponding first contact plug among the first contact plugs is electrically connected with the corresponding one of the pad patterns and the corresponding one of the word line patterns in a corresponding conductive layer among the plurality of conductive layers.

12. The memory device of claim 11, further comprising:
an insulating layer on the cell area, the cell wiring area, and the through-hole wiring area; and
an upper wiring on the insulating layer,
wherein the upper wiring electrically connects the one or more first word line patterns and the one or more second contact plugs.

13. The memory device of claim 1, further comprising:
a lower transistor connected with the first contact plugs and the second contact plugs.

14. The memory device of claim 13, wherein the lower transistor includes a first pass transistor and a second pass transistor, the first pass transistor is connected with the first contact plugs, the second pass transistor is connected with the one or more second contact plugs electrically connected with the one or more first word line patterns.

15. The memory device of claim 14, wherein the first pass transistor is on the cell wiring area, and the second pass transistor is on the through-hole wiring area.

16. The memory device of claim 14, wherein the first pass transistor and the second pass transistor are on the cell wiring area.

17. The memory device of claim 14, wherein the first pass transistor and the second pass transistor are on the through-hole wiring area.

18. A memory device comprising:

a first semiconductor layer and a second semiconductor layer overlapping each other, wherein the first semiconductor layer includes a substrate including a cell area, a cell wiring area, and a through-hole wiring area, word line patterns on the cell area and the cell wiring area, a channel structure on the cell area, first contact plugs on the cell wiring area, and second contact plugs on the through-hole wiring area, the word line patterns are stacked on the substrate and spaced from each other in a vertical direction, wherein the word line patterns comprise one or more first word line patterns and a plurality of second word line patterns, the vertical direction is perpendicular to an upper surface of the substrate, and the word line patterns extend to the cell wiring area in a direction parallel to the upper surface of the substrate, the channel structure extends in the vertical direction, the first contact plugs extend in the vertical direction, each of the first contact plugs is electrically connected with a corresponding one of the second word line patterns, insulated from remaining word line patterns other than the corresponding one of the second word line patterns, and extending above and below the corresponding one of the second word line patterns, and the second contact plugs extend in the vertical direction, and each of one or more second contact plugs of the second contact plugs is electrically connected with a corresponding one of the one or more first word line patterns through a connecting via that terminates at the corresponding one of the first word line patterns.

19. A memory device comprising:

a first semiconductor layer and a second semiconductor layer overlapping each other and being bonded to each other, wherein the first semiconductor layer includes:

a substrate including a cell area, a cell wiring area, and a through-hole wiring area;

word line patterns provided in the cell area and the cell wiring area, stacked on the substrate to be spaced from each other in a vertical direction perpendicular to an upper surface of the substrate, and extended to the cell wiring area in a direction parallel to the upper surface of the substrate, wherein the word line patterns comprise one or more first word line patterns and a plurality of second word line patterns;

a channel structure provided in the cell area and extended in the vertical direction;

first contact plugs extended in the vertical direction in the cell wiring area, electrically connected with a corresponding one of the second word line patterns, insulated from remaining word line patterns other than the corresponding one of the second word line patterns, and extending above and below the corresponding one of the second word line patterns; and second contact plugs provided in the through-hole wiring area and extended in the vertical direction, wherein the second semiconductor layer includes a driving circuit electrically connected with the word line patterns, and wherein each of one or more second contact plugs of the second contact plugs is electrically connected with a corresponding one of the one or more first word line patterns through a connecting via that terminates at the corresponding one of the first word line patterns.

20. The memory device of claim 19, wherein the first semiconductor layer includes a plurality of first semiconductor layers, wherein the plurality of first semiconductor layers include a first lower semiconductor layer on the second semiconductor layer and a first upper semiconductor layer provided on the first lower semiconductor layer.

* * * * *